US008856705B2

(12) United States Patent
Shroff et al.

(10) Patent No.: US 8,856,705 B2
(45) Date of Patent: Oct. 7, 2014

(54) MISMATCH VERIFICATION DEVICE AND METHODS THEREOF

(75) Inventors: Mehul D. Shroff, Austin, TX (US);
Sanjay R. Parihar, Austin, TX (US);
Edward O. Travis, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/466,642

(22) Filed: May 8, 2012

(65) Prior Publication Data
US 2013/0305202 A1    Nov. 14, 2013

(51) Int. Cl.
G06F 17/50    (2006.01)

(52) U.S. Cl.
USPC ............................................. 716/111

(58) Field of Classification Search
USPC .................................. 716/100, 111
See application file for complete search history.

(56) References Cited

U.S. PATENT DOCUMENTS

| | | | |
|---|---|---|---|
| 6,661,638 B2 | 12/2003 | Jackson et al. | |
| 6,891,395 B2* | 5/2005 | Wells et al. | 326/38 |
| 7,111,269 B2* | 9/2006 | Satapathy et al. | 716/102 |
| 7,353,475 B2 | 4/2008 | White et al. | |
| 7,367,008 B2 | 4/2008 | White et al. | |
| 7,506,277 B1 | 3/2009 | Arora et al. | |
| 7,565,638 B2* | 7/2009 | Hoerold | 716/106 |
| 7,665,054 B1 | 2/2010 | Gopalakrishnan et al. | |
| 8,601,430 B1* | 12/2013 | Shroff et al. | 716/137 |
| 8,640,079 B2* | 1/2014 | Majumder et al. | 716/139 |
| 2005/0010905 A1* | 1/2005 | Noirot-Nerin | 717/121 |
| 2005/0091627 A1* | 4/2005 | Satapathy et al. | 716/12 |
| 2007/0033552 A1* | 2/2007 | Li | 716/4 |
| 2007/0250805 A1* | 10/2007 | Wang et al. | 716/21 |
| 2009/0106716 A1* | 4/2009 | Aleksanyan et al. | 716/5 |
| 2011/0172979 A1* | 7/2011 | Bansal et al. | 703/4 |
| 2011/0219352 A1* | 9/2011 | Majumder et al. | 716/139 |
| 2013/0091481 A1* | 4/2013 | Su et al. | 716/122 |

OTHER PUBLICATIONS

U.S. Appl. No. 13/596,337, filed Aug. 28, 2012, entitled "Device Matching Tool and Methods Thereof".
Non-Final Office Action mailed Feb. 28, 2013 for U.S. Appl. No. 13/596,337, 20 pages.
Notice of Allowance mailed Jul. 31, 2013 for U.S. Appl. No. 13/596,337, 9 pages.

* cited by examiner

Primary Examiner — Suchin Parihar

(57) ABSTRACT

A method can include identifying a device design comprising first and second instantiations of a device, identifying a layer of the device design, identifying a first region of the device design for the first instantiation based on the layer of the first instantiation, and a second region of the device design for the second instantiation based on the layer of the second instantiation. identifying a first compare layer of the device design that comprises a plurality of first compare features including a first compared feature within the first region and a second compared feature within the second region, determining a difference between the first compared feature and the second compared feature, and determining if the difference meets a tolerance to determine if the first instantiation matches the second instantiation.

20 Claims, 8 Drawing Sheets

MISMATCH VERIFICATION DEVICE AND METHODS THEREOF

CROSS-REFERENCE TO RELATED APPLICATION(S)

The present application is related to co-pending U.S. patent application Ser. No. 13/596,337, entitled "DEVICE MATCHING TOOL AND METHODS THEREOF" filed on Aug. 28, 2012, the entirety of which is herein incorporated by reference.

FIELD OF THE DISCLOSURE

The present disclosure relates generally to integrated circuits, and more particularly, to design tools for integrated circuits.

BACKGROUND

Because of their complexity, integrated circuits, such as systems on a chip (SOCs), are typically designed using automated design tools, such as a computer-aided design (CAD) system. The CAD system can include automated processes to implement, verify, and improve performance, reliability, and manufacturability of the device design. For example, to verify reliability of the device design, the CAD system simulates the behavior of the device based on input stimuli and determines whether physical attributes of the device conform to design rule specifications.

In certain instances it can be desirable for devices of a same type to exhibit performance characteristics that are closely matched. Traditionally this has been accomplished by ensuring that the placement and routing of such devices themselves are the same, thus improving the performance similarity of the signal processing performed by each of the matched devices. For example, sense amplifiers, differential pairs, operational amplifiers, current mirrors, and other circuits can be designed to have similar electrical performance characteristics to other devices of the same type by matching their placement and routing to each other. However, even when the mask layer shapes that make up the devices are the same and the matched devices are both compliant with a common set of design rules, the devices may operate sufficiently differently from each other to cause unacceptable mismatches in the electrical performance of the devices for an intended application. Accordingly, there is a need for techniques to determine whether the extent of mismatch in circuits or devices that are expected to perform similarly to each other is acceptable.

BRIEF DESCRIPTION OF THE DRAWINGS

The present disclosure may be better understood, and its numerous features and advantages made apparent to those skilled in the art, by referencing the accompanying drawings.

DETAILED DESCRIPTION

Figure 1:
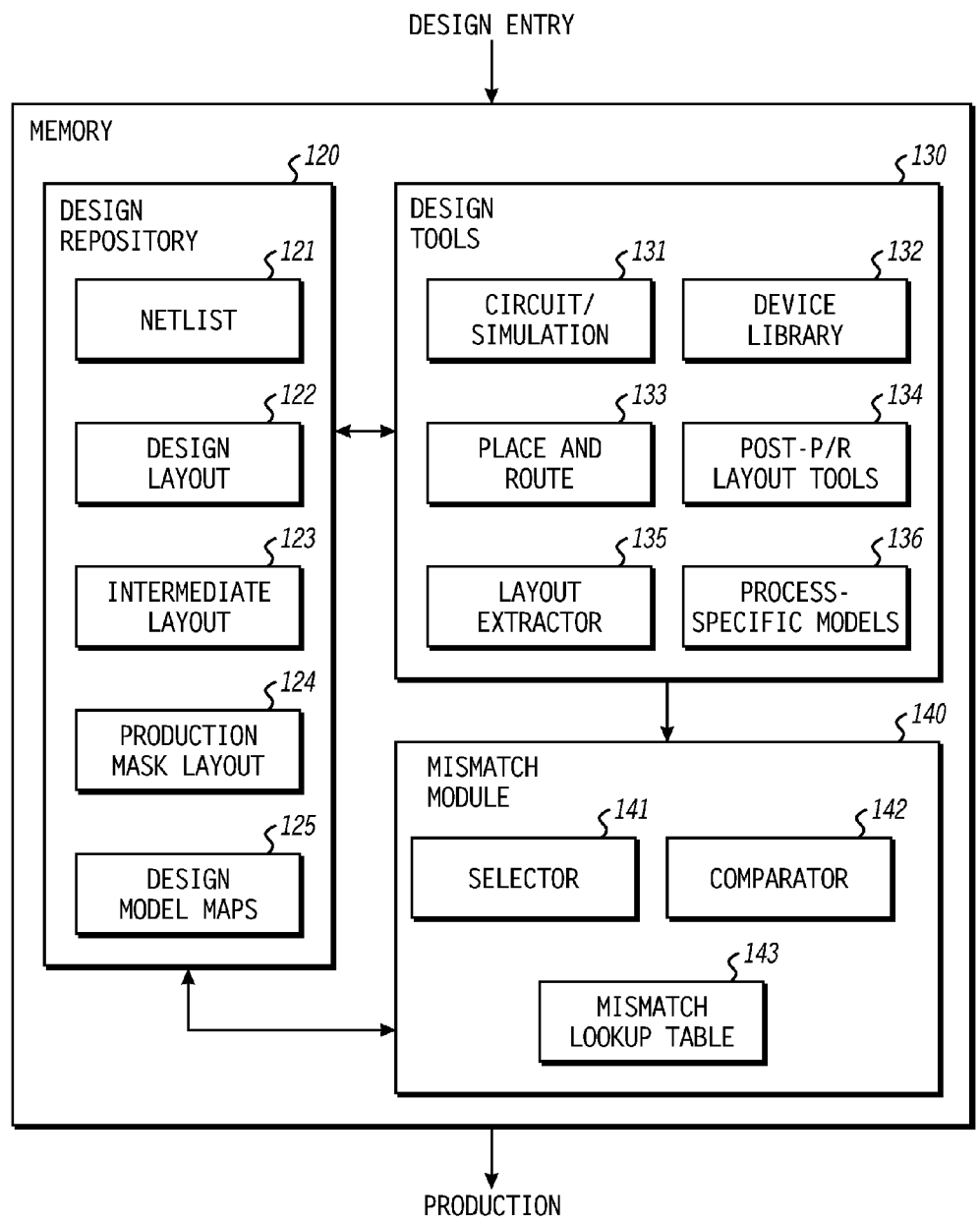
FIG. 1 is a block diagram illustrating an integrated circuit design system including computer-aided design (CAD) application modules in accordance with a specific embodiment of the present disclosure.

FIGS. 1-15 illustrate an integrated circuit design process and techniques for verifying the functionality, reliability, and manufacturability of an integrated circuit design. One or more representations of the integrated circuit design can be maintained in an integrated circuit design system. For example, a netlist can include a schematic-level representation of the devices that make up the integrated circuit design (the device design) such as logic gates, comparators, analog circuits, and the like, and the components that make up the device design (the component design) such as transistors, capacitors, resistors, and other devices, each of which can themselves be considered devices. A layout can include a physical representation of the various mask layers of an integrated circuit design, and can include polygonal information corresponding to the device design, including the components of the device and their specific features, such as transistor active areas, transistor gate areas, metal interconnects, and the like. Other representations of an integrated circuit design can be maintained to support simulation and analysis of the operation of a device that is to be fabricated based upon the integrated circuit design (the fabricated integrated circuit). For example, an integrated circuit design can include representations associated with logical verification, timing verification, electrical verification, and the like.

In accordance with a specific embodiment of the present disclosure, devices of an integrated circuit design that are expected to perform more similarly to each other than would otherwise be guaranteed by merely matching their respective layouts or by following device-level design rules, can be evaluated to determine if their performance is sufficiently matched for their intended purposes. In particular, a selector module of an integrated circuit design system identifies regions of interest corresponding to a first instantiation and a second instantiation of a particular device type that are to be closely matched. A comparator module of the integrated circuit design system evaluates one or more desired characteristics within the identified regions of interest associated with the first and second instantiations to determine if the desired characteristic within each region of interest meets a desired level of similarity. If not, the dissimilarity indicates a likelihood of mismatched performance.

The regions of interest identified by the selector module can be determined based on design features that can further be based on geometries of one or more mask layer features of the integrated circuit design that define the devices being matched. For example, an active area that is adjacent to an instantiation of a device being matched, but not part of the device, can affect the performance of that instantiation by virtue of stresses that the adjacent active regions induce in the active region of the instantiation, and more specifically, by virtue of the stresses that they induce in the channel region of the instantiation. Thus, variations in the shapes and locations of active regions adjacent to devices being matched can cause a performance mismatch between these instantiations. The sizes of the regions of interest identified by the selector module can be determined based on known process effects between particular features. For example, a particular process, which will be used to manufacture the integrated circuit having the devices being matched, will have known stress characteristics associated with its active areas that will be used by engineers to determine the region of interest surrounding active regions of the devices being matched.

It will be appreciated, therefore, that the regions of interest can also be larger or smaller than the geometries of the mask layer features of the device, depending upon the particular characteristic effect being analyzed. For example, the region of interest that surrounds an active area of a device being matched can be much larger than the geometry of the active region, in order to evaluate adjacent active regions. In an alternate example that determines whether or not there are significant differences in cross-coupling effects between a transistor gate and overlaying metal layer, the area of interest of a device can be coincident with the transistor gate layout, to identify only a metal layer feature directly overlaying the gate.

Thus, while the selector module determines regions of interest, the comparator module determines whether differences within the regions of interest between the instantiations of the devices are acceptable differences for a particular characteristic, e.g., features, being matched. These differences can be determined between the regions of interest being matched by comparing a particular feature or set of features associated with the region of interest of one device with the same feature or set of features associated with the region of interest of the other device. The amount of feature variation determined by this comparison can be used to determine whether the electrical mismatch introduced by this feature is significant, i.e., whether the feature needs modification.

FIG. 1 illustrates an embodiment of an integrated circuit design system 100 including computer-aided design (CAD) application modules. Integrated circuit design system 100 is operable to facilitate the design of an integrated circuit. As such, integrated circuit design system 100 represents a system implemented on one or more computers, and includes a memory 110 of the one or more computers that store a design repository 120, design tools 130, and a mismatch module 140. Design repository 120 includes one or more device design files (design files) used for storing representations of an integrated circuit design, and can include an application programming interface (API) to permit application modules to access and manipulate the attributes of the integrated circuit design that are represented in the design files. As such, design repository 120 includes one or more of the following: a netlist 121, a design layout 122, an intermediate layout 123, production mask layout 124, and design model maps 125. Design repository 120 can further include other representations of an integrated circuit design, not shown, such as a register-transfer level (RTL) model, a behavioral model, and the like.

Figure 2:
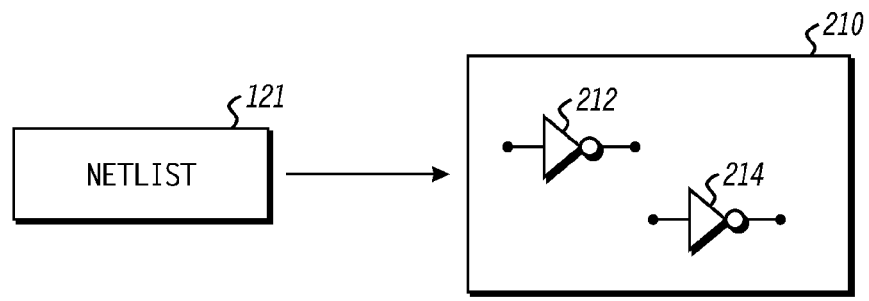
FIG. 2 is a depiction of a schematic represented by a netlist of the integrated design system shown in FIG. 1.
Figure 3:
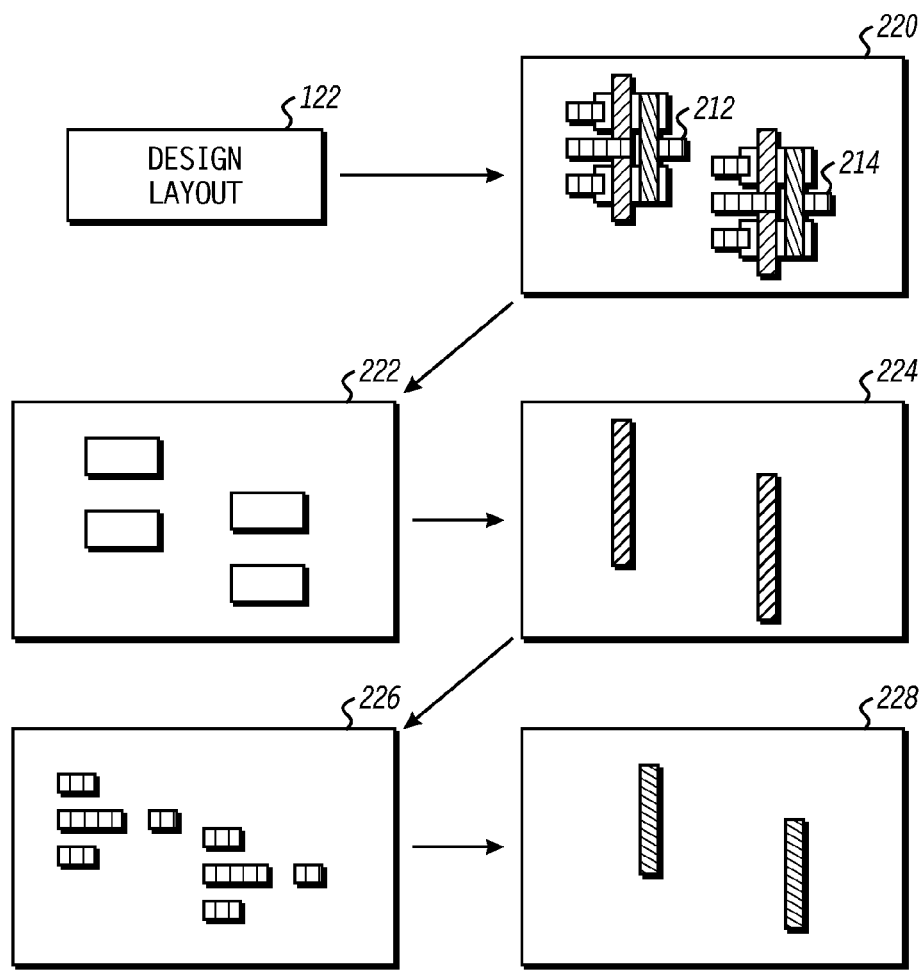
FIG. 3 is a depiction of masks represented by a design layout of the integrated design system shown in FIG. 1.
Figure 4:
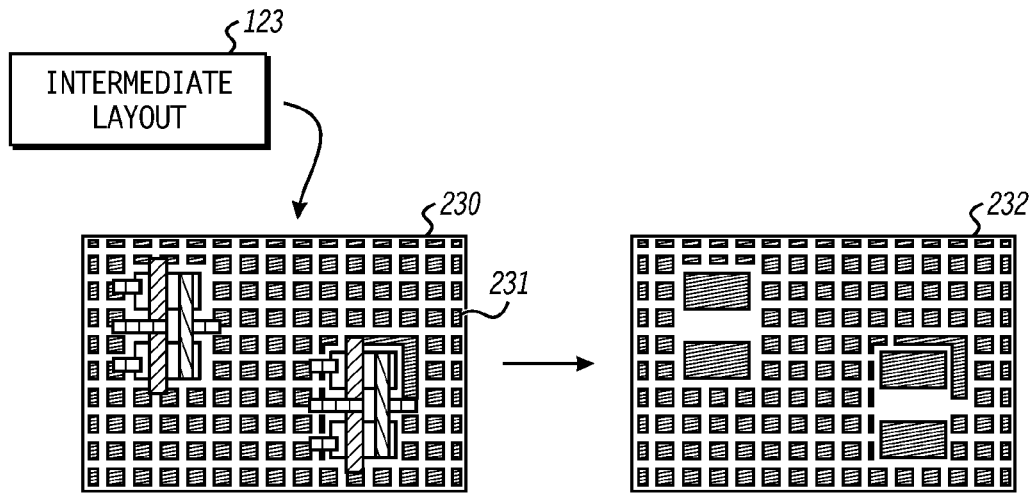
FIG. 4 is a depiction of masks represented by a intermediate layout of the integrated design system shown in FIG. 1.

Netlist 121 provides a schematic description of the integrated circuit design and can be based on circuit and signal simulations performed on the integrated circuit design. For example, FIG. 2 illustrates a schematic depiction 210 of a pair of devices 212 and 214 that are included in netlist 121. For ease of illustration, the devices 212 and 214 are presumed to be inverters. However, the concepts described herein are likely to be applied to devices of greater complexity that include additional transistors and active and passive components. For example, the concepts described herein can be used to determine electrical performance variations between digital logic devices as well as between analog devices. Design layout 122 (FIG. 1) stores a physical layout of the integrated circuit design. For example, FIG. 3 illustrates a device design layout 220 of devices 212 and 214 as represented in design layout 122. Device design layout 220 represents various mask features from a plurality of masks, including, active area features illustrated in masking shape 222; gate dielectric/gate features illustrated in masking shape 224; first level interconnect metal features as illustrated in masking shape 226; and second level interconnect metal features as illustrated in masking shape 228. Note that contacts between the active layers and conductive layers and between various conductive layers are not shown. Intermediate layout 123 (FIG. 1) stores a modified version of design layout 122 that includes various mask features added to support manufacturability of the semiconductor device. For example, intermediate layout 123 can result from performing design-for-manufacturing (DFM) modifications such as tiling, or other post-design processing on design layout 122. FIG. 4 illustrates an intermediate layout mask 230 of devices 212 and 214 as represented in intermediate layout 123 that includes various tiling features 231, which are active areas added around the active areas of devices 212 and 214, as represented in intermediate layout 123. Masking shape 232 illustrates a representation of the active area mask after inclusion of the tiling features 231.

Figure 5:
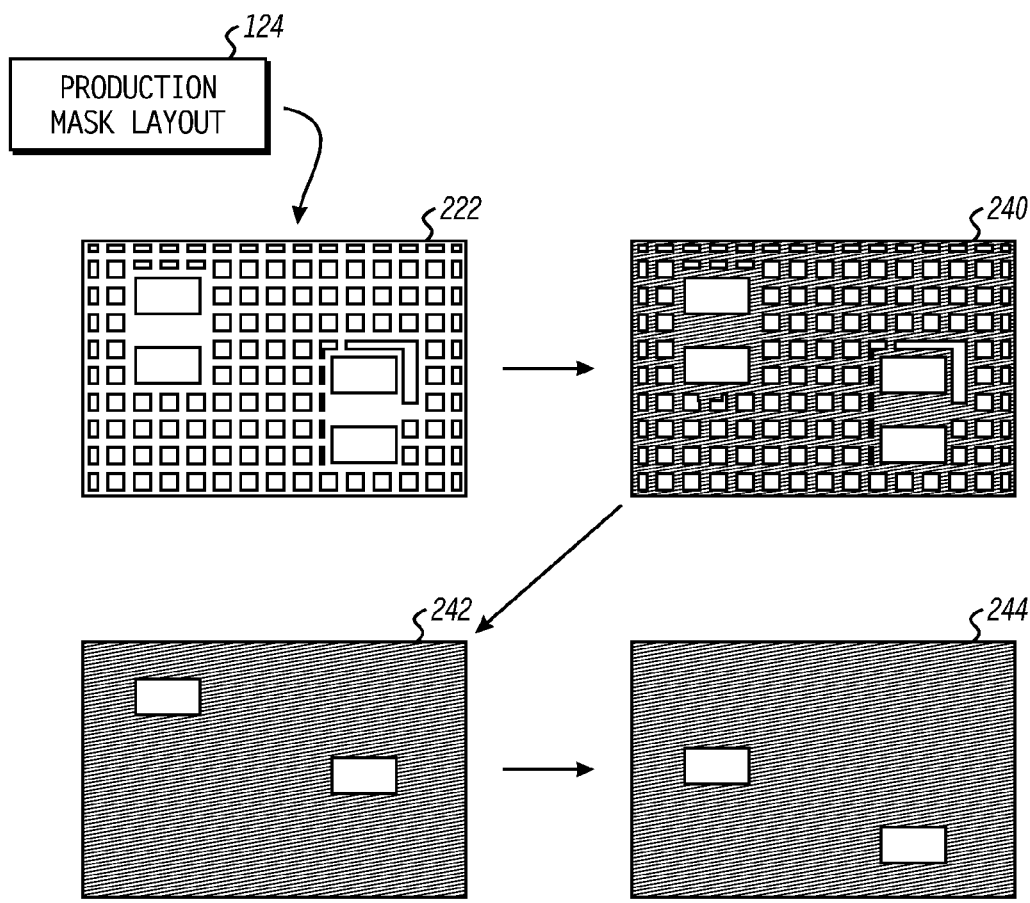
FIG. 5 is a depiction of production level masks in a production mask layout of the integrated design system shown in FIG. 1.

Production mask layout 124 (FIG. 1) stores production level mask representations of the integrated circuit design that takes into account various fabrication process steps that are necessary to the fabrication of the integrated circuit design, but that are transparent to designers of integrated circuit device designs, and associated layout tools. For example, production mask layout 124 can include optical proximity correction (OPC) features as needed for various mask layers, as well as additional production masks where the mask shapes are derived from Boolean combinations of source layout shapes, for example, implant and stressor masks. For example, FIG. 5 illustrates production level masks associated with active area masking shapes 222, as represented in production mask layout 124. The production level masks include an isolation mask 240, a p-well mask 242, and an n-well mask 244. One skilled in the art will appreciate that production mask layout 124 can include other OPC features than those illustrated, such as serifs and anti-serifs. Design model maps 125 (FIG. 1) provide variations in the simulation and modeling of the design-specific effects of the integrated circuit design on the instantiations of the devices to be matched, and include mappings of the integrated circuit design for various effects, as described further, below.

Integrated circuit design system 100 (FIG. 1) includes various application modules such as design tools 130 and mismatch module 140, which itself may be a design tool. The application modules are configured to manipulate and analyze the integrated circuit design information included in design repository 120 to derive a desired representation of the integrated circuit design. During the design process, design repository 120 changes as a design progresses. For example, based on simulations of the integrated circuit design, a design repository 120 can be altered so that the integrated circuit design complies with a specification. For example, the netlist can be altered to add or remove devices, or components of devices, in order to meet desired timing requirements. Alternatively, the design layout 122 can be modified based upon post-place-and-route simulations to address various timing issues. The changes to the integrated circuit design are reflected by corresponding changes to design repository 120 that are evaluated by further simulation and testing.

Once the design process is complete, the integrated circuit design is used to fabricate the integrated circuit. For example, production mask layout 124 can include a representation of the integrated circuit design that includes information relating to physical photomask features that can be provided to a mask fabrication facility to prepare masks to be provided to an integrated circuit fabrication facility. In one embodiment, design tools 130 and mismatch module 140 include hardware modules, software modules, or a combination thereof. Each application module is executed as described herein to perform an associated design function. Integrated circuit design system 100 can include additional application modules that are associated with other aspects of the design process. For example, integrated circuit design system 100 can include a layout verification module operable to identify and validate a correspondence between information included at netlist 121 and physical information stored at design layout 122, a timing analysis module to verify that a fabricated integrated circuit based on the integrated circuit design can operate at a desired speed, and the like.

Figure 6:
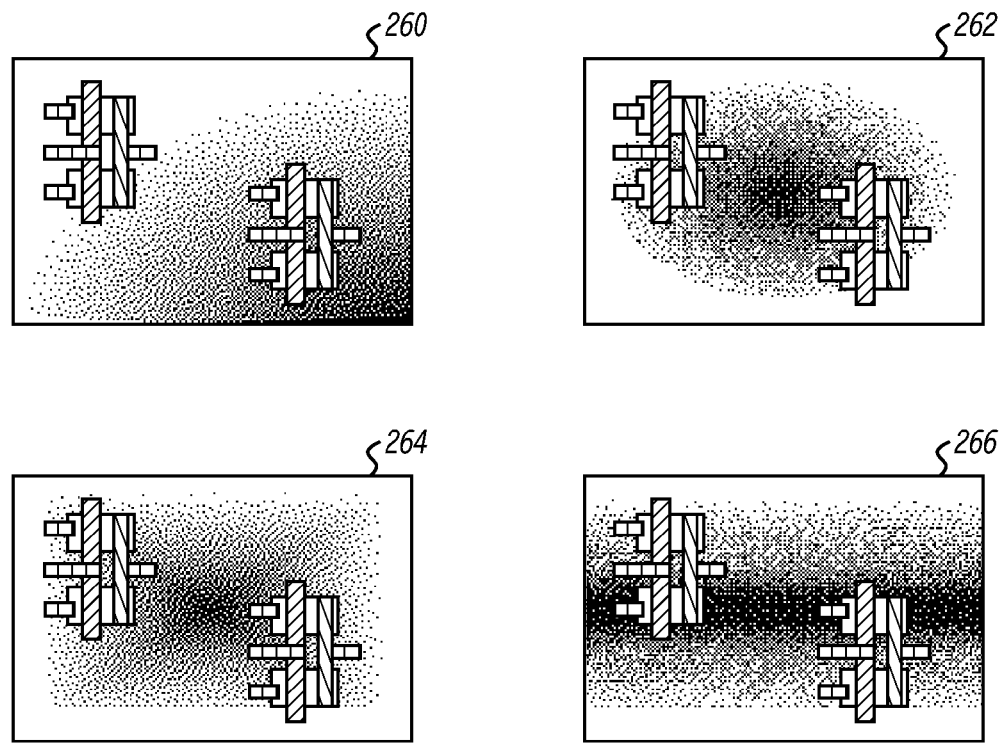
FIG. 6 is a depiction of mapping of process variations from a set of processing models of the integrated design system shown in FIG. 1.

Design tools 130 includes one or more application modules that are accessed to analyze and manipulate the attributes of the integrated circuit design, including circuit and simulation tools 131, a device library 132, place-and-route (P/R) tools 133, post-P/R layout tools 134, a layout extractor 135, and process-specific models 136. Circuit and simulation tools 131 provide designers with an ability to simulate various aspects of the integrated circuit design, including logical performance, real-time performance, power consumption, and the like. In particular, circuit and simulation tools 131 can operate on the files of design repository 120 to model the integrated circuit design for various conditions that are known to exist in the fabricated integrated circuit for a particular process. For example, a fabricated integrated circuit can exhibit varying performance characteristics based on the location a particular device relative to other devices/features, based on aging effects for the device, based on temperature sensitivity effects and based on other effects. As such, a device may be located in an area of the fabricated integrated circuit that has a temperature profile that can affect the electrical performance of the device. Further, the power environment experienced by the integrated circuit can affect the device, as can aging effects, current-resistance (I-R) drop, or current density. These and other process variables are simulated in circuit and simulation tools 131. FIG. 6 illustrates examples of mappings of some of these effects including a first process model variation map 260, a second process model variation map 262, a third process model variation map 264, and a fourth process model variation map 266, wherein darker regions of the mapped effects represent a greater magnitude. For example, one of the maps may represent a temperature gradient map, wherein the darker regions represent areas of higher temperature relative to lighter areas. Another map may represent a dielectric thickness map, wherein the darker regions represent areas of higher dielectric thickness relative to lighter areas.

Device library 132 (FIG. 1) includes various predefined devices, such as standard cells and parameterized cells, that can be used by the designer to implement desired functions. For example, a designer can choose to access device library 132 to select a standard inverter, operational amplifier, phase-locked loop, another integrated circuit device, or a combination thereof, rather than to design each of these devices individually. P/R tools 133 operate to locate (place) devices from netlist 121 at physical locations of the integrated circuit design, and to provide interconnections (route) between the devices. Post-P/R layout tools 134 operate to provide features for tiling, DFM, physical verification, and other features. Subsequent to place and route, layout extractor 135 can be used to translate some or all of the representations of physical information stored at design repository 120 into information representing physical characteristics of a particular device. For example, layout extractor 135 can determine for each device output of a device design an associated capacitance, resistance, and the like. Similarly, layout extractor 135 can determine various characteristics associated with individual interconnects. Layout extractor 135 may include a commercially available extractor, a proprietary extractor, or a combination thereof.

Simulation tools 131 can provide capacitance and resistance information in order to provide a more accurate timing simulation of a device design based upon the actual placement of devices and interconnect characteristics. With respect to comparing performance of devices that are to have matched performance, extraction tools can extract information associated with each instance of the device, such as capacitance and resistance information, as well as information proximate thereto, such as active area or density information, and other routing information as desired. With respect to a particular implementation of the present disclosure, layout extractor 135 can extract layout information associated with each instantiation of a device to be matched. Should instantiations have different orientations, the layout extractor 135 can compensate for the orientation differences by rotating, in order to facilitate comparisons of features proximate to each instantiation as needed.

Process-specific models 136 provide designers with an ability to simulate devices based upon specific aspects of the integrated circuit fabrication process that will be used to manufacture final devices. In particular, process-specific models 136 can be used in conjunction with the files of design repository 120 to model the integrated circuit design for various conditions that are known to exist with respect to a particular manufacturing process. For example, a fabricated device can be expected to exhibit a particular set of performance characteristics based on the gate geometries used with respect to a particular manufacturing process. In addition, it will be appreciated that the actual manufacturing process used to implement the integrated circuit can affect other performance characteristics of a device. Thus, the process specific models 136 are used to simulate a target process.

Mismatch module 140 is an application module operable to determine whether the electrical performance of a first instantiation of a device of the integrated circuit design matches the electrical performance of a second instantiation of a device of the same type. Hereinafter, the description of mismatch module 140 will be with reference to instantiations of devices. Mismatch module 140 includes a selector 141, a comparator 142, and a mismatch lookup table 143. In a particular embodiment, mismatch module 140 is included in design repository 120, in design tools 130, or a combination thereof. In another embodiment, mismatch module 140 is derived from information included in design repository 120, in design tools 130, or a combination thereof.

Selector 141 selects regions of interest for the device instantiations to be matched. For each instantiation, these regions of interest can include a portion of the device, all of the device, regions proximate the device, and the like. In a particular embodiment, selector 141 selects the regions of interest based on a design feature of the device instantiations being matched. A particular design feature of an instantiation, such as an active area or a channel region, can be specific to one or more mask layers of the integrated circuit design.

Comparator 142 compares a specified feature, referred to as a critical feature or a compare feature, within the regions of interest for each of the devices to be matched to determine if electrical performance for each device is matched with the other. In a particular embodiment, the critical features within a region of interest are represented by polygons, and the comparator performs a logical exclusive-OR (XOR) between the regions of interest to determine the differences between the polygons of respective instantiations, and whether these differences are within a critical feature tolerance. If the devices are matched (as defined by differences between the critical features being less than the critical feature tolerance), a match is indicated and further design work on the devices may not be necessary. If the devices are not matched (as defined by differences between the critical features exceeding the critical feature tolerance), then a mismatch is indicated and further design work may be performed to modify design repository 120 to obtain a better match between the devices. For example, features proximate to one or more instantiation can be moved. The operation of mismatch module 140 can be utilized at any stage of the design process. As such, devices can be matched in netlist 121, design layout 122, intermediate layout 123, and production mask layout 124. Note that, while features of mask layers are described herein, comparator 142 can also make comparisons based upon simulations of the integrated circuit design, where the comparisons are based upon predicted values for the features. For example, comparator 142 can compare predicted device widths, predicted dielectric thicknesses, or other predicted features, as needed or desired.

Design model maps 125 provide variations in the simulation and modeling of the design-specific effects of the integrated circuit design on the instantiations of the devices to be matched, and include mappings of the integrated circuit design for various effects as described above with respect to FIG. 6. In a particular embodiment, comparator 142 determines if variations in the values of the mappings between instantiations are within critical feature tolerances. In another embodiment, comparator 142 determines if the range of values across each instantiation, hereinafter described as delta ranges, are within a critical feature tolerance. For example, where the electrical performance matching of a pair of devices is affected by a design-specific effect, design model maps 125 can supply a permitted variation between each device of the pair of devices, or can supply a permitted delta range across each device. In another embodiment, the regions of interest are provided by selector 141 and comparator 142 to determine if the variations and delta ranges are within the permitted variations and permitted delta ranges provided by design model maps 125. The permitted variation between each instantiation of the devices to be matched, or the permitted delta range across each instantiation, is supplied by mismatch lookup table 143. For example, given a mapping of the expected temperature across an integrated circuit design, the value of the temperature may be deemed to be important to the matching of the performance of a pair of devices, and so a permitted variation between the expected temperatures for each device can be specified. If the difference in the expected temperature between the devices is greater than the permitted variation, the expected match between the devices may be poor. In other words, the permitted variation is a way to measure whether each device is on a same or similar contour of the associated design model map 125. Further, the delta range of temperatures experienced by each device of a pair of devices to be matched may be deemed to be important to the matching of the devices, and so a permitted delta range of the expected temperatures for each device can be specified. If the temperature difference across each device is greater than the permitted delta range, the expected match between the devices may be poor. In other words, the permitted delta range is a way to measure whether each device is in an area with a same or similar gradient of the contours of the associated design model map 125.

In a particular embodiment, mismatch lookup table 143 includes one or more match records, each of which identifies a particular set of features of a device design that can cause a mismatch in the performance of an instantiation for a particular manufacturing process. Each match record can identify the following: the device instantiations to be matched, a match record number, a selected feature, a region of interest dimension, a critical feature, and a critical feature tolerance. Table 1 provides an example of mismatch lookup table 143. Here, for example, the device instantiations to be matched include devices 510 and 520 of FIG. 8 (described below). In the example of Table 1, there are three match records, as described below with respect to FIGS. 10-13. The selected feature of each match record identifies a physical feature of the given device instantiations to be matched, and usually is a feature that is defined by one or more mask layers or a value at a location or set of locations as defined by a design model map. In the example of Table 1, the selected feature of match record 1 is the gate area of the instantiations, the selected feature of match record 2 is the active area of the instantiations, and the selected feature of match record 3 includes the devices of the instantiations. Other examples of selected features include: n-type active areas; p-type active areas; interconnects; certain levels of interconnects; channel regions; and other features as needed or desired. Typically, the select feature is associated with portions of the particular device type that affect performance variations between instantiations.

TABLE 1

Mismatch lookup table

| Match Devices | Match Record | Select Feature | ROI Dimension | Critical Feature | Critical Feature Tolerance |
|---|---|---|---|---|---|
| 510, 520 | 1 | Gate | 0 nm | Metal Overlay Layers | $\Delta XY < 40$ nm$^2$ |
| | 2 | Active Area | 20 nm | Active Masks | $\Delta X < 2$ nm $\Delta Y < 4$ nm |

TABLE 1-continued

Mismatch lookup table

| Match Devices | Match Record | Select Feature | ROI Dimension | Critical Feature | Critical Feature Tolerance |
|---|---|---|---|---|---|
| | 3 | Device | 0 nm | Temperature Map | $\Delta T_V < 3$ deg C. $\Delta T_{DR} < 0.5$ deg C. |

The region of interest (ROI) dimension is a dimension stored at the match record that is used to identify a region proximate the selected features of each instantiation, and is used to indicate the region that is to be analyzed by mismatch module 140. This region to be analyzed is referred to as the region of interest. In the example of Table 1, the region of interest dimension applied to the gate area of match record 1 is 0 nanometers (nm), i.e., only the gate area is selected, the region of interest dimension applied to the active area of match record 2 is 20 nm, and the region of interest dimension applied to the device area of match record 3 is 0 nm. The region of interest dimension for the select features can also be a negative value, indicating that the region of interest includes only a portion of the select feature. Typically, the select feature is associated with portions of the particular device type that affect performance variations between instantiations. It may be noted that the region of interest may also have different dimensions in the x and y directions relative to the device or feature of interest and that for a given layer, there may be more than one region of interest, for example, for different process steps such as etch and CMP.

Each match record also includes a critical feature that indicates a characteristic/feature to be analyzed within the region of interest dimension, and which can be the same or different than the selected feature. In the example of Table 1, the critical feature for the gate area of match record 1 includes the metal mask layers that overlay the gate mask, the critical feature for the active area of match record 2 includes the active mask layers that make up the active area, and the critical feature for the device of match record 3 includes a temperature map, such as a temperature map from design model maps 125. Typically, the critical feature of the device design is a feature that causes a performance variation to occur at the portion of the device type identified by the selected feature.

The critical feature tolerance quantifies how much critical feature variation between instantiations is an acceptable amount in order to deem the pair of devices as "matched" or "mismatched." In the example of Table 1, the critical feature tolerance for match record 1 is provided as an area of $\Delta XY < 40$ nm$^2$. Here, an area of mismatch for the gate layer and the overlaying metal layers between the instantiations is determined, and if the difference in the area of the mismatch between the instantiation is less than the critical feature tolerance, then the instantiations are "matched", but if the difference in the area is greater than the critical feature tolerance, then the instantiations are "mismatched" as described further in FIG. 10 below. Also, the critical feature tolerance for match record 2 can be described by separate tolerances for the X- and the Y-dimensions as $\Delta X < 2$ nm and $\Delta Y < 4$ nm. Here, linear dimensions of mismatch for the active area masks between the instantiations are determined, and if the differences in the feature dimensions in each direction is less than the critical feature tolerance, then the instantiations are "matched", but if any length of the mismatch for the active area masks is greater than the critical feature tolerance, then the instantiations are "mismatched" as described further in FIGS. 11 and 12, below.

Further, the critical feature tolerance for match record 3 is described by variation consistent with a map of a temperature variation ($T_V$) of $\Delta T_V < 3$ deg C., and by a delta range ($T_{DR}$) of $\Delta T_{DR} < 0.5$ deg C. Note that, in a particular embodiment, a mapping of a design process can be described by dividing the integrated circuit design into cells (i.e., squares), and ascribing a value of the design process within each cell. As such, a particular select feature can encompass more than one cell, and thus be describable by more than one value. Here, for example, where a device encompasses four cells, a separate comparison can be performed between each corresponding cell of the different instantiations, or alternatively, a single combined metric, such as an average value or a range, can be utilized.

The matching of devices contrasts with a design rule in that the design rule can ensure that a particular feature on each device meets common criteria and therefore that the devices meet a particular performance level within a defined range, while matching ensures that the electrical performance of each device is similar based upon the surroundings of the devices. As such, the designs of a pair of devices that are to be matched can each meet a particular set of design rules and furthermore have closely or identically matched layout, yet they may fail to have similar enough electrical performance for a particular application because of the presence of surrounding devices, components, or features, or process model effects on the pair of devices.

Figure 7:
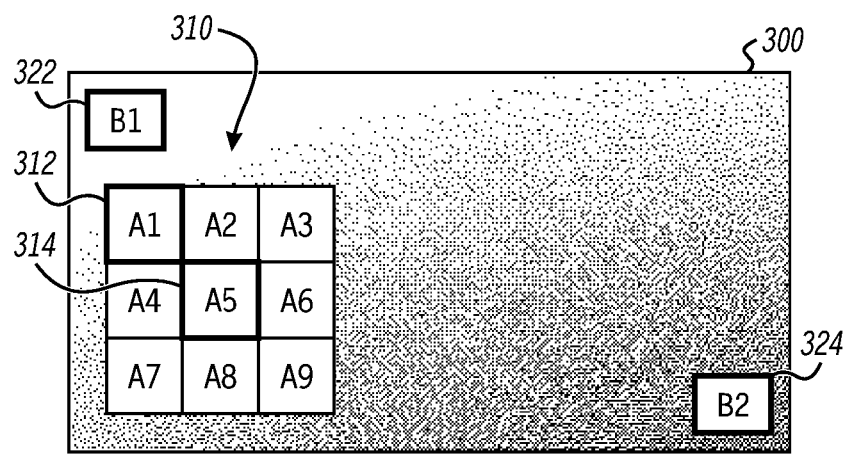
FIG. 7 is an overview of a fabricated integrated circuit in accordance with a specific embodiment of the present disclosure.

FIG. 7 illustrates an embodiment of a fabricated integrated circuit 300, including an array of devices 310, and devices B1 (322) and B2 (324). Array 310 illustrates a portion of fabricated integrated circuit 300 where several similar elements, labeled A1 through A9, are to be matched. For example, array 310 can include static random access memory (SRAM) cells, parallel analog signal paths, or other devices which are similar and are in close proximity to each other on fabricated integrated circuit 300. Here, even though the devices are arranged close to each other, the circuit environment for each device A1-A9 may be different from the others. To illustrate, element A1 (312) is on a corner of array 310, and is surrounded by the elements labeled A2 and A4. Element A5 (314) is in the middle of array 310, and is surrounded by the elements labeled A2, A4, A6, and A8. Thus the performance of element A1 can be matched with element A5 based on an extracted version of the relevant process database, in order to more accurately account for the different environments of elements A1 and A5. For example, the extracted database can account for parasitic capacitances and resistances that are unique to each element, for cross-talk between elements A1 and A5, and for other effects from neighboring elements to array 310.

Elements 322 and 324, labeled B1 and B2, respectively, represent elements that are of the same type, and that are to be matched, but that are on different portions of fabricated integrated circuit 300. For example, elements B1 and B2 can include fringe capacitors, transistors, operational amplifiers, or other elements which are of the same type and are intended to exhibit the same electrical performance, but are on different portions of fabricated integrated circuit 300. Here, because elements B1 and B2 are arranged on different portions of fabricated integrated circuit 300, the local process variation environment for element B1 may be different from the process variation environment for element B2. For example, elements B1 and B2 may be in portions of fabricated integrated circuit 300 that are experiencing different lattice stresses, different power, thermal, or current gradients, different topographical densities, that are subject to different aging effects, or otherwise be in regions that experience different process conditions. As such, the electrical performance of element B1 can be compared with the electrical performance of element B2 based on a mapping of various process models on fabricated integrated circuit 300.

Figure 8:
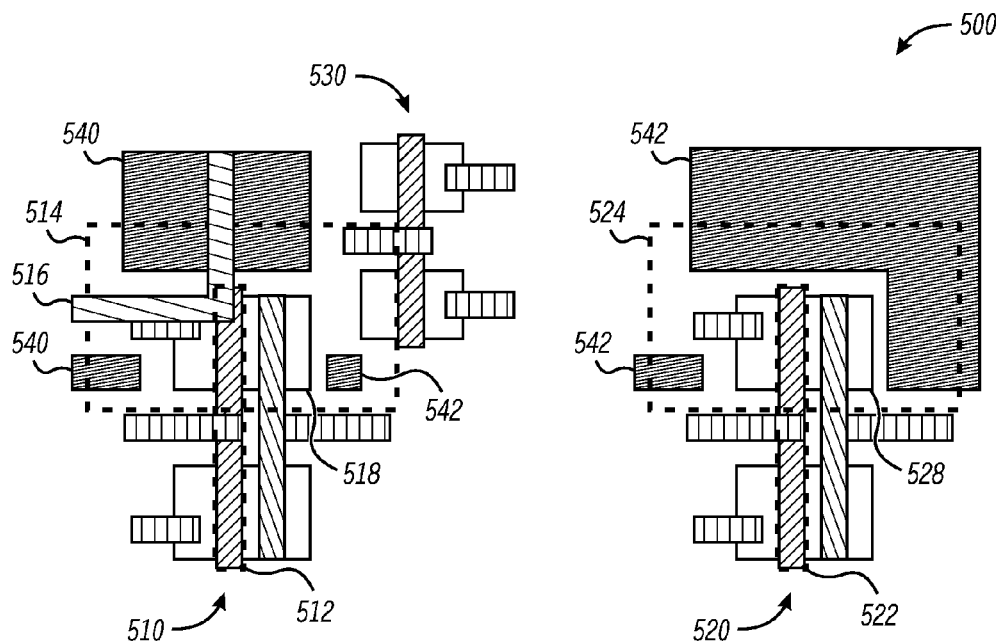
FIG. 8 is a layout view of a pair of devices of the integrated circuit shown in FIG. 7 in accordance with a specific embodiment of the present disclosure.

FIG. 8 illustrates an embodiment of a pair 500 of devices 510 and 520 of the integrated circuit shown in FIG. 7. Devices 510 and 520 are depicted with elements of the integrated circuit that are proximate to devices 510 and 520. As such, device 510 is in proximity to a CMOS switch 530, and to other active areas 540, and device 520 is in proximity to other active areas 542. Note that active areas 540 and 542 can represent adjacent active or passive devices or tiling features, and interconnects and other layer features that are not shown. Device 510 is also overrun by an interconnect metal layer 516. Note that distances between devices 510 and 520 are not depicted to scale, and that devices 510 and 520 can represent elements of fabricated integrated circuit 300 that are close to each other, such as elements 312 and 314, or can represent elements of fabricated integrated circuit 300 that are on different portions of fabricated integrated circuit 300, such as elements 322 and 324. A selector similar to selector 141 operates to select regions of interest 512 and 514 for element 510, and respective matching regions of interest 522 and 524 for element 520 based upon a match record.

Figure 9:
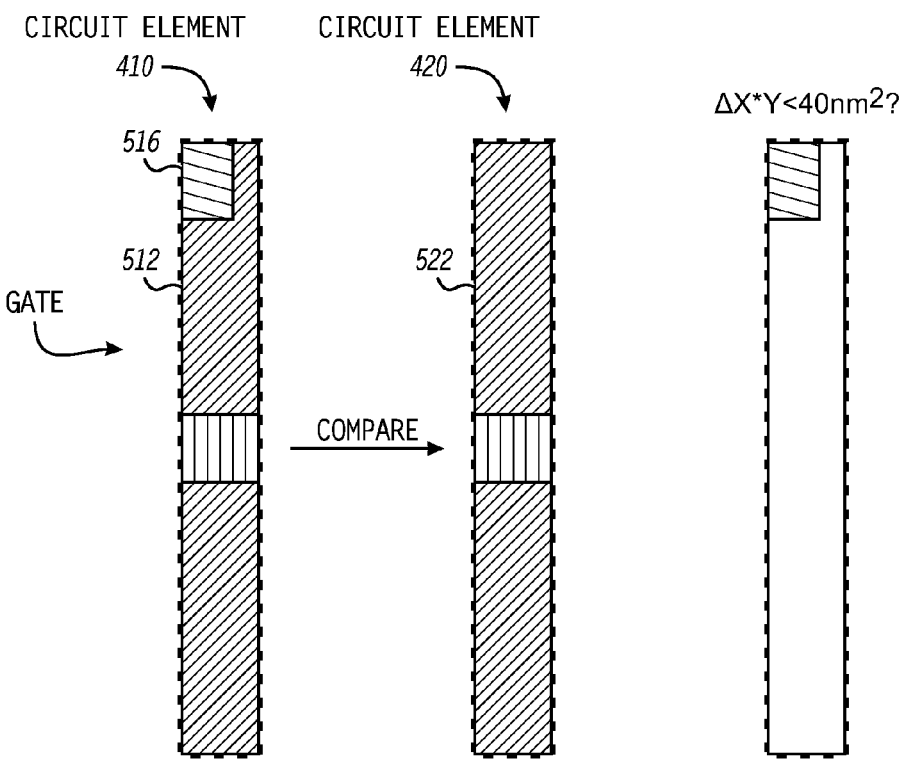
FIG. 9 is a magnified layout view of regions of interest shown in FIG. 8 in accordance with a specific embodiment of the present disclosure.

Regions of interest 512 and 522 relate to features of devices 510 and 520 formed by the gates of respective devices 510 and 520. For example, an undesirable capacitive coupling in the gates of devices 510 and 520 can depend upon an amount of interconnect metal overrunning the respective gates being greater than or equal to 40 nm$^2$. Match record 1 of Table 1 illustrates this example, where, as illustrated in FIG. 9, the capacitive coupling to the gate of device 510 can be matched to the capacitive coupling of the gate of device 520, and to confirm that the area of overrunning metal is different between the instantiations by less than 40 nm$^2$. Note that a particular region of interest can be compared based upon different circuit layers, or upon different masks that make up the layers. When the comparison fails, then the designer of the integrated circuit can iterate the design of the associated layer or mask to ensure that circuit devices 510 and 520 are matched within the desired tolerances.

Figure 10:
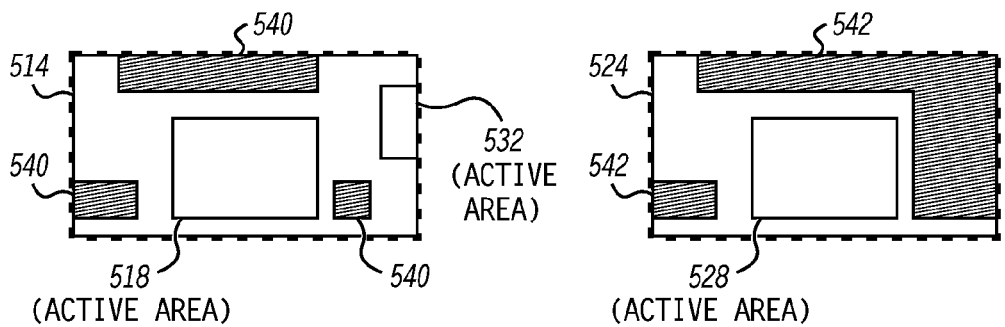
FIG. 10 is a layout view of the regions of interest shown in FIG. 8 in accordance with a specific embodiment of the present disclosure.

Regions of interest 514 and 524 (FIG. 8) relate to active area features surrounding the active areas of devices 510 and 520. For example, matching of the electrical performance of devices 510 and 520 can be dependent upon the proximity of tiling areas and active areas of other devices to the active areas of devices 510 and 520. Match record 2 of Table 1 illustrates this example, where, as illustrated in FIG. 10, region of interest 514 includes an active area 518 of circuit device 510, an active area 532 of switch 530, and active areas 540, and region of interest 524 includes an active area 528 of circuit device 520 and active areas 542.

Figure 11:
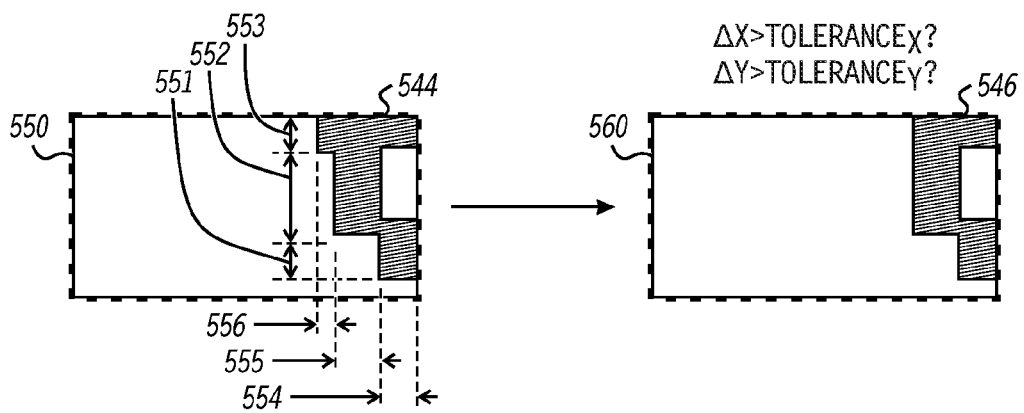
FIG. 11 is a layout view of the differences between the regions of interest shown in FIG. 10 in accordance with a specific embodiment of the present disclosure.

FIG. 11 illustrates a comparison 550 of regions of interest 514 and 524, made with respect to active areas 518, 528, and 532, and active areas 540 and 542. In a particular embodiment, comparison 550 is generated by performing a logical XOR between regions of interest 514 and 524, such that a difference area 544 is defined as the area where active areas 518 and 532 and active areas 540 are different from active area 528 and active areas 542. Difference area 544 can be measured to determine dimensions 551-556, as illustrated. Dimensions 551-553 are determined with respect to a first axis of fabricated integrated circuit 300, here illustrated by vertical dimensions, and dimensions 554-556 are determined with respect to a second axis of fabricated integrated circuit 300, here illustrated by horizontal dimensions. The match record defines tolerance values for dimensions 551-556, such that, if a portion of difference area 544 has a dimension that is less than the tolerance value, the electrical performance of devices 510 and 520 will be within the allowed tolerance with respect to each other, and if the portion of difference area 544 has a dimension that is greater than the tolerance value, the electrical performance of devices 510 and 520 will be different from each other.

Thus, for example, tiling features on fabricated integrated circuit 300 can create different stresses on the substrate that can affect the electrical performance of circuit devices 510 and 520. Therefore, it can be desirable to modify the layout of the elements that are proximate to circuit devices 510 and 520 to better match their electrical performance. Further, the effects from the tiling features on circuit devices 510 and 520 can be greater in one axis than in the other. As such, the tolerance value for the first dimension is not necessarily the same as the tolerance value for the second dimension. For example, dimensions 551, 552, and 553 can be 25 nm, 45 nm, and 15 nm, respectively, with a tolerance of 20 nm for the first axis. Further, dimensions 554, 555, and 556 can be 20 nm, 20 nm, and 10 nm, respectively, with a tolerance of 15 nm for the second axis. A modified comparison 560 is generated by performing a logical XOR between regions of interest 514 and 524, taking into account the tolerances for each axis, such that a difference active area 546 is defined as the area where active areas 540 are different from active areas 542 by greater than the tolerances for each axis. Here, for example, because dimension 553 is smaller than the tolerance value for the first axis, and dimension 556 is smaller than the tolerance value for the second axis, the portion of difference area 544 that is defined by dimensions 553 and 556 is excluded from modified comparison 560, and a design iteration can be performed on the active layer to eliminate difference shape 546 so that the electrical performance of circuit devices 510 and 520 can be more closely matched. In another embodiment, areas of the difference shapes can be used in conjunction with, or in contrast to, the dimensions in each axis. Moreover, while it is an option for critical features to result in comparison of individual shapes, it may also be necessary to compare many or all features of a mask including active areas and tiles as one entity.

Figure 12:
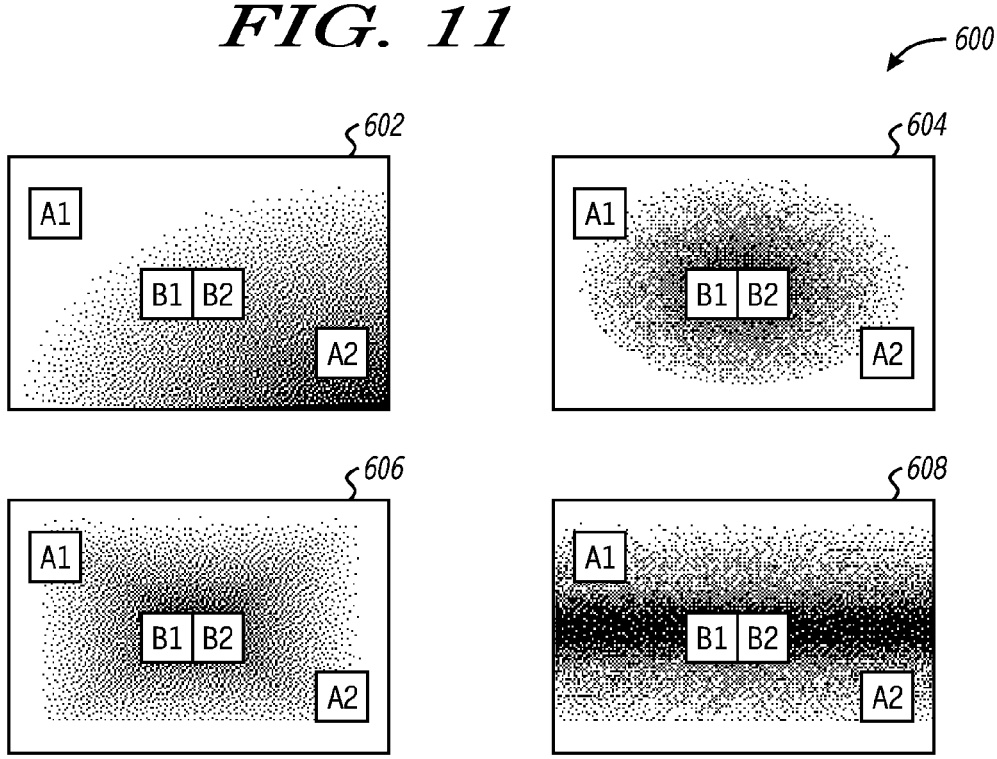
FIG. 12 is an overview of a fabricated integrated circuit illustrating maps of process models in accordance with a specific embodiment of the present disclosure.

FIG. 12 illustrates exemplary embodiments of maps of the process variations on a fabricated integrated circuit 600. Fabricated integrated circuit 600 is mapped as showing the effect of a first mapped process variation 602, a second mapped process variation 604, a third mapped process variation 606, and a fourth mapped process variation 608. For example, mapped process variations 602, 604, 606, and 608 can represent one or more of a stress gradient, a thermal gradient, a feature density map, a checkbox value, a current gradient, an IR drop, a power distribution, a power profile, a parasitic resistance/capacitance (RC) extraction, a lithography imaging profile, an oxide thickness profile, a planarity profile, or another process variation. The shading of mapped process variations 602, 604, 606, and 608 is illustrative of a particular value for the associated process variation. As such, a lighter coloration can represent a higher value for the associated process variation than a darker coloration, or can represent a lower value, as needed or desired.

Fabricated integrated circuit 600 includes a first pair of devices, labeled "A1" and "A2," that are desired to have their electrical performance matched to each other, and a second pair of devices, labeled "B1" and "B2," that are desired to have their electrical performance matched to each other. Mapped process variation 602 indicates that device A1 is in an area of fabricated integrated circuit 600 that has a very different process variation value than device A2, and that devices B1 and B2 are in an area of fabricated integrated circuit 600 that has a nearly constant process variation value. As such, devices A1 and A2 may have a source of mismatch with respect to the first process variation, while devices B1 and B2 may not have a source of mismatch with respect to the first process variation. Mapped process variation 604 indicates that devices A1 and A2 are in an area of fabricated integrated circuit 600 that has a nearly constant process variation value, and that devices B1 and B2 are in an area of fabricated integrated circuit 600 that has a highly variable process variation value. Thus devices A1 and A2 may not have a source of mismatch with respect to the second process variation, but devices B1 and B2 may have a source of mismatch with respect to the second process variation.

Mapped process variation 606 indicates that both of the pairs of devices A1 and A2, and B1 and B2 are in areas of fabricated integrated circuit 600 that have significantly different process variation values. Thus both of the device pairs A1 and A2, and B1 and B2 may have sources of mismatch with respect to the third process variation. Mapped process variation 608 indicates that both of the pairs of devices A1 and A2, and B1 and B2 are in areas of fabricated integrated circuit 600 that have nearly constant process variation values. As such, neither pair of devices A1 and A2, and B1 and B2 may have sources of mismatch with respect to the fourth process variation. In a particular embodiment, the average value for a process variation can be calculated across a region of interest for devices to be matched, and the average value can be provided as the value to comparator 142, as described above. In another embodiment, the range of process variation values across a region of interest for devices to be matched can be provided to comparator 142. In yet another embodiment, values of process variation at each corresponding point within a region of interest may be provided to comparator 142 to be compared with the corresponding points in the device instantiations. One or more of mapped process variations 602, 604, 606, or 608 are exemplified by match record 3 of Table 1.

Figure 13:
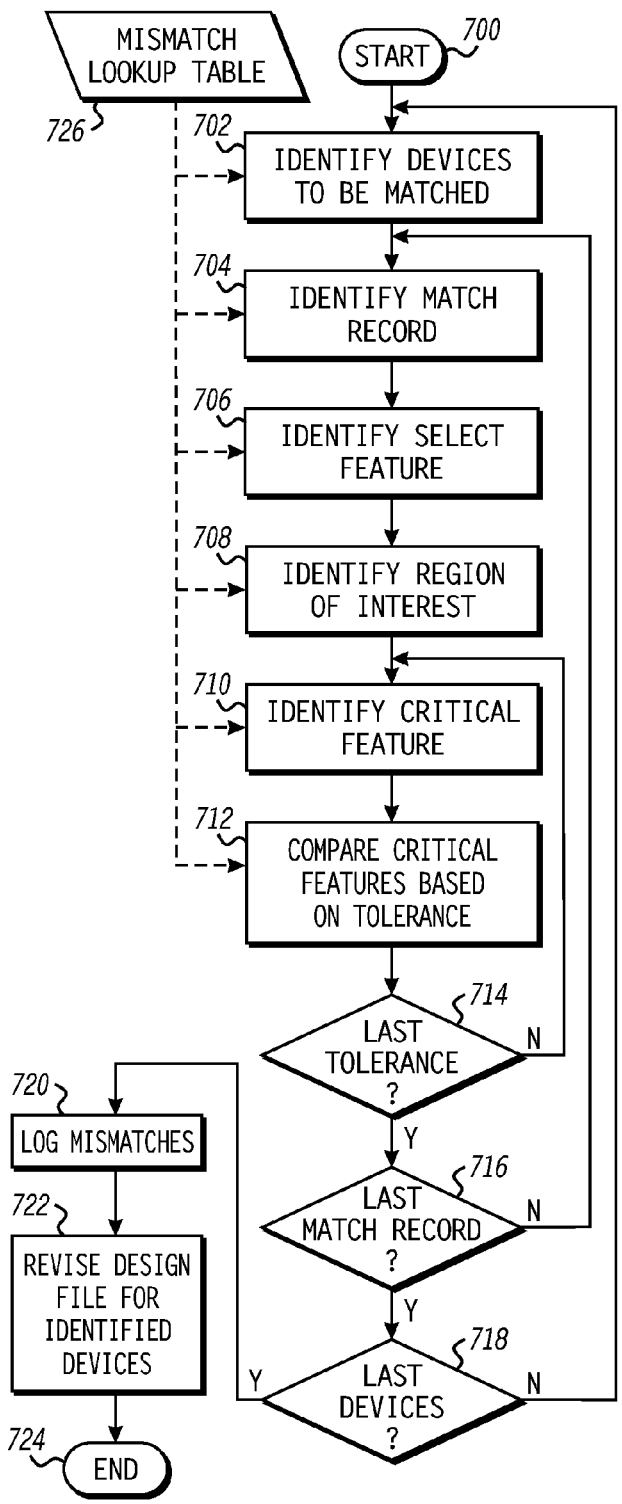
FIG. 13 is a flow diagram illustrating a method for performing a mismatch analysis of matched elements of a fabricated integrated circuit in accordance with a specific embodiment of the present disclosure.

FIG. 13 illustrates an embodiment of a method for performing a mismatch analysis of matched devices of a fabricated integrated circuit, starting at block 700. Devices of an integrated circuit that are to be matched to each other are identified in block 702. The devices are identified based upon a mismatch lookup table 726, similar to the mismatch lookup table of Table 1. For example, devices 510 and 520 (FIG. 8) of fabricated integrated circuit 300 can be selected from netlist 121 for matching. Note that, while the examples provided herein may relate to one or more databases of a design repository, the examples are not meant to be limiting, and the method is suitably performed upon any database of a design file, and at any stage of the design process. A match record is identified for matching in block 704. The match record is identified based upon mismatch lookup table 726. For example, match record 1 in Table 1 can be selected for matching. A select feature is identified for matching in block 706. The select feature is identified based upon mismatch lookup table 726. For example, the gate areas of devices 510 and 520 can be selected for matching. A region of interest for the identified devices is selected for matching in block 708. The region of interest is identified based upon mismatch lookup table 726. The region of interest can include all, or a portion of the select feature, or can be based upon a dimension surrounding the select feature. For example, the region of interest can include the gates of the identified devices, as shown in match record 1 of Table 1, and the region of interest can have a 0 nm dimension, indicating that the entire gate, and no more or no less, is selected for matching.

A critical feature of the region of interest is identified for matching in block 710. The critical feature is identified based upon mismatch lookup table 726. For example, the metal overlay layers are identified as the critical feature to be matched in match record 1 of Table 1. In another example, a variation or a delta range in a particular parameter from design model maps 125 can be identified, such as the variation and delta range in the temperature map, as indicated in match record 3 of Table 1. The critical features of each instantiation of the devices to be matched are compared to determine if the instantiations are matched to within a critical feature tolerance in block 712. The critical feature tolerance is identified based upon mismatch lookup table 726. For example, devices 510 and 520 can be determined to be matched according to match record 1 of Table 1 if the area of metal overlaying the respective gates differs by less than 40 nm$^2$.

A decision is made as to whether or not the critical feature tolerance is the last critical feature tolerance for the match record in decision block 714. If not, the "NO" branch of decision block 714 is taken, and the method returns to block 710 where another critical feature of the region of interest is identified for matching. For example, as indicated by match record 2 of Table 1, the active masks can have a different critical feature tolerance in the X direction than in the Y direction. If the critical feature tolerance is the last critical feature tolerance that is to be matched, the "YES" branch of decision block 714 is taken, and a decision is made as to whether or not the selected match record is the last match record of match record table 726 in decision block 716. If not, the "NO" branch of decision block 716 is taken, and the method returns to block 704 where a next match record is identified. If the selected match record is the last match record that is to be matched, the "YES" branch of decision block 716 is taken, and a decision is made as to whether or not the selected devices are the last devices to be matched in decision block 718. If not, the "NO" branch of decision block 718 is taken, and the method returns to block 702 where another pair of devices of the integrated circuit that are to be matched to each other are identified. If the selected devices are the last devices that are to be matched, the "YES" branch of decision block 718 is taken, and the mismatches are logged in block 720. The logged mismatches are considered in revising the design file for the identified devices in block 722, and the method ends in block 724. For example, if the comparison of an active mask identifies that the active area areas within the regions of interest are different by more than 2 nm in the X-dimension, as indicated by match record 2, then the gate mask can be modified to correct the mismatch. Note that the order for blocks 714, 716 and 718 are exemplary, and that the order thereof may be changed as needed or desired. Moreover, while the illustrated flowchart shows sequential operation, the steps of the method may be performed in parallel branches, as needed or desired.

Figure 14:
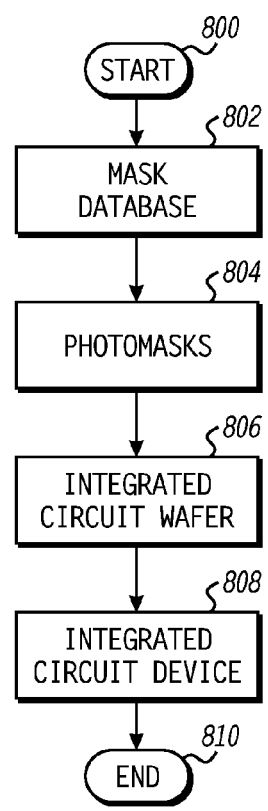
FIG. 14 is a flow diagram illustrating another method in accordance with a specific embodiment of the present disclosure.

FIG. 14 illustrates an embodiment of a method for fabricating integrated circuit devices, starting at block 800. At block 802, information included at a mask database is provided to a photo-lithography mask manufacturing facility. The method proceeds to block 804 where photomasks are manufactured and provided to an integrated circuit wafer-fabrication facility. The method proceeds to block 806 where an integrated circuit wafer is manufactured using the photomasks. The method proceeds to block 808 where integrated circuit devices are manufactured from integrated circuit die included at the integrated circuit wafer, and the method ends at block 810.

Figure 15:
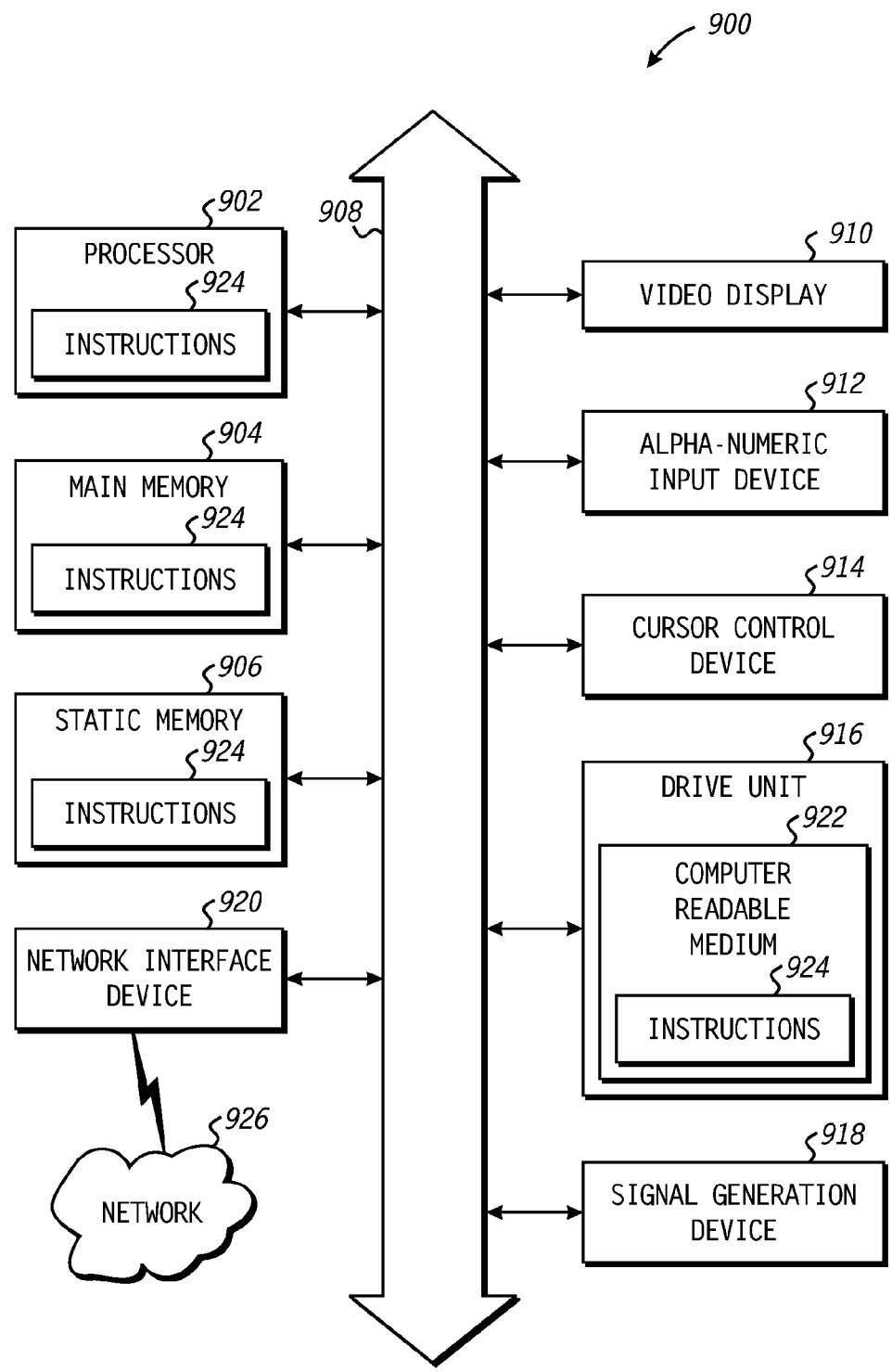
FIG. 15 is a block diagram of a processing system in accordance with at least one embodiment of the present disclosure.

FIG. 15 is a block diagram of a data processing system 900 in accordance with at least one embodiment of the present disclosure. Processing system 900 can include a set of instructions that can be executed to manipulate processing system 900 to perform any one or more of the methods or functions disclosed above. Processing system 900 may operate as a standalone device or may be connected, e.g., using a network, to other processing systems or peripheral devices.

In a networked deployment, processing system 900 may operate in the capacity of a server or as a client user computer in a server-client user network environment, or as a peer processing system in a peer-to-peer (or distributed) network environment. Further, while a single processing system 900 is illustrated, the term "system" shall also be taken to include any collection of systems or sub-systems that individually or jointly execute a set, or multiple sets, of instructions to perform one or more computer functions.

Processing system 900 may include one or more processors 902, e.g., a central processing unit (CPU), a graphics processing unit (GPU), or both. Moreover, processing system 900 can include a main memory 904 and a static memory 906 that can communicate with each other via a bus 908. As shown, processing system 900 may further include a video display unit 910, such as a liquid crystal display (LCD), an organic light emitting diode (OLED), a flat panel display, a solid state display, or a cathode ray tube (CRT). Additionally, processing system 900 may include an input device 912, such as a keyboard, and a cursor control device 914, such as a mouse. Processing system 900 can also include a disk drive unit 916, a signal generation device 918, such as a speaker, and a network interface device 920.

In a particular embodiment, disk drive unit 916 may include a computer readable medium 922 in which one or more sets of instructions 924, e.g. software, can be embedded. Further, instructions 924 may embody one or more of the methods or logic as described herein. In a particular embodiment, instructions 924 may reside completely, or at least partially, within main memory 904, static memory 906, and/or within processor 902 during execution by processing system 900. Main memory 904 and processor 902 also may include computer readable media. Network interface device 920 can provide connectivity to a network 926, e.g., a wide area network (WAN), a local area network (LAN), or other network.

In accordance with various embodiments of the present disclosure, the methods described herein may be implemented, in whole or in part, by software programs executable by processing system 900. The present disclosure contemplates a computer readable storage device (e.g., main memory 904, static memory 906, or drive unit 916) that includes instructions 924 or receives and provides instructions 924 for execution. Further data representative of an integrated circuit design can be stored in one or more of the computer readable storage devices for access by processing system 900 during execution of instructions 924 so as to implement the methods described above.

While the computer readable storage device is shown to be a single storage device, the term "computer readable storage device" includes a single storage device or multiple storage devices, such as a centralized or distributed database, and/or associated caches and servers that store one or more sets of instructions. The term "computer readable storage device" shall also include any storage device that is capable of storing a set of instructions for execution by a processor or that causes a processing system to perform any one or more of the methods or operations disclosed herein.

In a particular non-limiting, exemplary embodiment, the computer readable storage device can include a solid-state memory such as a memory card or other package that houses one or more non-volatile read-only memories. Further, the computer readable storage device can be a random access memory or other volatile re-writeable memory. Additionally, the computer readable storage device can include a magneto-optical or optical medium, such as a disk or tapes or other storage device.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and processing systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In this document, relational terms such as "first" and "second", and the like, may be used solely to distinguish one entity or action from another entity or action without necessarily requiring or implying any actual relationship or order between such entities or actions or any actual relationship or order between such entities and claimed elements. The term "another", as used herein, is defined as at least a second or more. The terms "including," "having" or any variation thereof, as used herein, are defined as comprising. The terms "integrated circuit," "device," "component," "feature," or any variations thereof, as used herein, are understood to be devices.

Other embodiments, uses, and advantages of the disclosure will be apparent to those skilled in the art from consideration of the specification and practice of the disclosure disclosed herein. The specification and drawings should be considered as examples only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method comprising:
   identifying at a data processing system, a device design comprising a first instantiation of a device and a second instantiation of the device;

identifying a first layer of the device design;
identifying a first region of the device design for the first instantiation based on the first layer of the first instantiation, and a second region of the device design for the second instantiation based on the first layer of the second instantiation;
identifying a first compare layer of the device design, the first compare layer comprising a plurality of first compare features including a first compared feature within the first region and a second compared feature within the second region;
determining a first difference between the first compared feature and the second compared feature; and
determining if the first difference meets a first tolerance to determine if the first instantiation matches the second instantiation.

2. The method of claim 1, further comprising:
identifying a second layer of the device design;
identifying a third region of the device design for the first instantiation based on the second layer of the first instantiation, and a fourth region of the device design for the second instantiation based on the second layer of the second instantiation;
identifying a second compare layer of the device design, the second compare layer comprising a plurality of second compared features including a third compared feature within the first region and a fourth compared feature within the second region;
determining a second difference between the third compared feature and the fourth compared feature; and
determining if the second difference meets a second tolerance to further determine if the first instantiation matches the second instantiation.

3. The method of claim 2, further comprising:
identifying a fifth region of the device design for the first instantiation based on the first layer of the first instantiation, and a sixth region of the device design for the second instantiation based on the first layer of the second instantiation;
identifying a third compare layer of the device design, the third compare layer comprising a plurality of third compare features including a fifth compared feature within the fifth region and a sixth compared feature within the sixth region;
determining a third difference between the fifth compared feature and the sixth compared feature; and
determining if the third difference meets a third tolerance to further determine if the first instantiation matches the second instantiation.

4. The method of claim 1, further comprising:
identifying a second compare layer of the device design, the second compare layer comprising a plurality of second compare features including a third compared feature within the first region and a fourth compared feature within the second region;
determining a second difference between the third compared feature and the fourth compared feature; and
determining if the second difference meets a second tolerance to further determine if the first instantiation matches the second instantiation.

5. The method of claim 1 further comprising:
subsequent to determining if the first instantiation matches the second instantiation, performing a design stage on the device design, wherein the first layer of the device design is changed in response to the design stage; and
in response to performing the design stage:
identifying a second layer of the device design;
identifying a third region of the device design for the first instantiation based on the second layer of the first instantiation, and a fourth region of the device design for the second instantiation based on the second layer of the second instantiation;
identifying a second compare layer of the device design, the second compare layer comprising a plurality of second compare features including a third compared feature within the third region and a fourth compared feature within the fourth region;
determining a second difference between the third compared feature and the fourth compared feature; and
determining if the second difference meets a second tolerance to further determine if the first instantiation matches the second instantiation.

6. The method of claim 1, wherein the first and second instantiations, the first layer, the first compare layer, and the first and second regions are provided to the data processing system in a match record.

7. The method of claim 1, further comprising:
identifying at the data processing system, a map of a result of a design model as applied to the device design;
identifying a third region of the device design for the first instantiation, and a fourth region of the device design for the second instantiation;
determining a first variation of the result for the third region and a second variation of the result for the fourth region;
determining a second difference between the first variation and the second variation; and
determining if the second difference meets a second tolerance to further determine if the first instantiation matches the second instantiation.

8. The method of claim 7, further comprising:
determining a first delta range of the result for the third region and a second delta range of the result for the fourth region;
determining a third difference between the first delta range and the second delta range; and
determining if the third difference meets a third tolerance to further determine if the first instantiation matches the second instantiation.

9. The method of claim 7, wherein the design model is for at least one of a lattice stress, a lattice stress gradient, a current profile, a time-averaged IR drop, a thermal gradient, a density map, a power distribution, a trench thickness, a device width, and an imaging profile.

10. The method of claim 1, further comprising creating a design file specifying an integrated circuit die in response to determining if the first instantiation matches the second instantiation, wherein the integrated circuit die includes the first and second instantiations of the device.

11. The method of claim 10, further comprising manufacturing the integrated circuit die based upon the design file.

12. A system comprising:
a data processor operable to execute instructions to:
identify a device design comprising a first instantiation of a device and a second instantiation of the device;
identify a first layer of the device design;
identify a first region of the device design for the first instantiation based on the first layer of the first instantiation, and a second region of the device design for the second instantiation based on the first layer of the second instantiation;
identify a first compare layer of the device design, the first compare layer comprising a plurality of first compare features including a first compared feature within the first region and a second compared feature within the second region;

determine a first difference between the first compared feature and the second compared feature; and determine if the first difference meets a first tolerance to determine if the first instantiation matches the second instantiation.

13. The system of claim 12, wherein the data processor further operable to execute instructions to:

identify a second layer of the device design, wherein:
the first region is further based upon the second layer of the first instantiation and the second region is further based upon the second layer of the second instantiation; and
the plurality of first compare features further includes a third compared feature within the first region and a fourth compared feature within the second region;

determine a second difference between the third compared feature and the fourth compared feature; and determine if the second difference meets a second tolerance to further determine if the first instantiation matches the second instantiation.

14. The system of claim 13, wherein the data processor further operable to execute instructions to:

identify a third region of the device design for the first instantiation based on the second layer of the first instantiation, and a fourth region of the device design for the second instantiation based on the second layer of the second instantiation;

identify a second compare layer of the device design, the second compare layer comprising a plurality of second compare features including a fifth compared feature within the third region and a sixth compared feature within the fourth region;

determine a third difference between the fifth compared feature and the sixth compared feature; and determine if the third difference meets a third tolerance to further determine if the first instantiation matches the second instantiation.

15. The system of claim 12, wherein the data processor further operable to execute instructions to:

identify a third region of the device design for the first instantiation based on the first layer of the first instantiation, and a fourth region of the device design for the second instantiation based on the first layer of the second instantiation;

identify a second compare layer of the device design, the second compare layer comprising a plurality of second compare features including a third compared feature within the third region and a fourth compared feature within the fourth region;

determine a second difference between the third compared feature and the fourth compared feature; and determine if the second difference meets a second tolerance to further determine if the first instantiation matches the second instantiation.

16. The system of claim 12, wherein the data processor further operable to execute instructions to:

subsequent to determining if the first instantiation matches the second instantiation, perform a design stage on the device design, wherein the first layer is changed in response to the design stage; and in response to performing the design stage:
determine a second difference between the first compared feature and the second compared feature; and
determine if the second difference meets the first tolerance to further determine if the first instantiation matches the second instantiation.

17. The system of claim 12, wherein the data processor further operable to execute instructions to:

identify at the data processing system, a map of a result of a design model as applied to the device design;

identify a third region of the device design for the first instantiation based on the map of the first instantiation, and a fourth region of the device design for the second instantiation based on the map of the second instantiation;

determine a first value of the result for the third region and a second value of the result for the fourth region;

determine a second difference between the first value and the second value; and determine if the second difference meets a second tolerance to further determine if the first instantiation matches the second instantiation.

18. The system of claim 17, wherein the data processor further operable to execute instructions to:

determine a first delta range of the result for the third region and a second delta range of the result for the fourth region;

determine a third difference between the first delta range and the second delta range; and determine if the third difference meets a third tolerance to further determine if the first instantiation matches the second instantiation.

19. A method comprising:

identifying at a data processing system, a device design comprising a first instantiation of a device and a second instantiation of the device;

identifying at the data processing system, a map of a result of a design model as applied to the device design;

identifying a first region of the device design for the first instantiation, and a second region of the device design for the second instantiation;

determining a first variation of the result for the first region and a second variation of the result for the second region;

determining a first difference between the first variation and the second variation; and determining if the first difference meets a second tolerance to determine if the first instantiation matches the second instantiation.

20. The method of claim 19, further comprising:

determining a first delta range of the result for the first region and a second delta range of the result for the second region;

determining a second difference between the first delta range and the second delta range; and determining if the second difference meets a second tolerance to further determine if the first instantiation matches the second instantiation.

* * * * *